(12) United States Patent
Lin et al.

(10) Patent No.: US 10,057,975 B2
(45) Date of Patent: Aug. 21, 2018

(54) ELECTRONIC ASSEMBLIES AND METHOD FOR MANUFACTURING THE SAME

(71) Applicant: ASUSTeK COMPUTER INC., Taipei (TW)

(72) Inventors: Hank Lin, Taipei (TW); Bin-Chyi Tseng, Taipei (TW); Chung-Han Tsai, Taipei (TW); Shih-Keng Chuang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 15/703,041

(22) Filed: Sep. 13, 2017

(65) Prior Publication Data

US 2018/0098415 A1    Apr. 5, 2018

(30) Foreign Application Priority Data

Sep. 30, 2016  (TW) .............................. 105131792 A

(51) Int. Cl.
| | |
|---|---|
| *H05K 1/00* | (2006.01) |
| *H05K 1/02* | (2006.01) |
| *H01R 12/57* | (2011.01) |
| *H05K 1/11* | (2006.01) |
| *H05K 1/18* | (2006.01) |
| *H05K 3/10* | (2006.01) |
| *H05K 3/30* | (2006.01) |
| *H05K 3/40* | (2006.01) |

(52) U.S. Cl.
CPC ........... *H05K 1/0213* (2013.01); *H01R 12/57* (2013.01); *H05K 1/115* (2013.01); *H05K 1/181* (2013.01); *H05K 3/10* (2013.01); *H05K 3/306* (2013.01); *H05K 3/40* (2013.01); *H05K 2201/10022* (2013.01)

(58) Field of Classification Search
CPC ............... H05K 1/00; H05K 1/11; H05K 1/18
USPC ........ 174/260, 548, 557; 361/719, 724, 726, 361/752, 767
See application file for complete search history.

(56) References Cited

U.S. PATENT DOCUMENTS

| | | | |
|---|---|---|---|
| 6,501,211 B1* | 12/2002 | Nasrollahzadeh | G01L 5/246 310/317 |
| 6,501,660 B1* | 12/2002 | Ho | G06F 13/4081 361/724 |
| 2002/0196611 A1* | 12/2002 | Ho | G06F 13/4081 361/752 |
| 2004/0071040 A1* | 4/2004 | Funaba | G11C 5/04 365/232 |

(Continued)

FOREIGN PATENT DOCUMENTS

| | | |
|---|---|---|
| CN | 101699666 A | 4/2010 |
| TW | 201436662 A | 9/2014 |

*Primary Examiner* — Xiaoliang Chen
(74) *Attorney, Agent, or Firm* — McClure, Qualey & Rodack, LLP

(57) ABSTRACT

An electronic assembly and a method for manufacturing the electronic assembly are provided. The method includes: configuring a chip and a connector at a first wiring layer of a PCB, and determining a first trace between a first pin of the chip and a first pin of the connector, and a second trace between a second pin of the chip and a second pin of the connector according to a first internal resistance of the chip, a second internal resistance of the chip, a first internal resistance of the connector, and a second internal resistance of the connector.

10 Claims, 8 Drawing Sheets

(56) References Cited

U.S. PATENT DOCUMENTS

| | | | |
|---|---|---|---|
| 2007/0081376 A1* | 4/2007 | Funaba | G11C 5/04 365/63 |
| 2007/0152771 A1* | 7/2007 | Shan | H05K 1/023 333/33 |
| 2007/0153508 A1* | 7/2007 | Nall | F21V 21/002 362/219 |
| 2011/0273091 A1* | 11/2011 | Fujikawa | G09G 3/3266 315/51 |
| 2014/0262441 A1 | 9/2014 | Wu | |
| 2015/0373848 A1* | 12/2015 | Seok | H01C 13/02 361/679.31 |

\* cited by examiner

ELECTRONIC ASSEMBLIES AND METHOD FOR MANUFACTURING THE SAME

CROSS-REFERENCE TO RELATED APPLICATION

This application claims the priority benefit of TW application serial No. 105131792, filed on Sep. 30, 2016. The entirety of the above-mentioned patent application is hereby incorporated by references herein and made a part of specification.

BACKGROUND OF THE INVENTION

Field of the Invention

The disclosure relates to an electronic assembly and a method for manufacturing the electronic assembly.

Description of the Related Art

The number of electronic components in an electronic device is increased when the functions provided by the electronic device become more complex. Therefore, the electronic components are not easily configured on a Printed circuit board (PCB) due to the increased density of the traces. Furthermore, the Signal integrity (SI) of the electronic device should be considered in configuration. For example, part of the signal is reflected along the transmission line during the signal transmission when the characteristic impedance of a transmission line does not match with the load impedance. Thus the signal loss is generated and affects signal integrity. If the signal integrity is poor, the function of the electronic device is not stable or even not workable.

BRIEF SUMMARY OF THE INVENTION

According to an aspect of the disclosure, an electronic assembly is provided. The electronic assembly comprises: a Printed circuit board (PCB) including a first wiring layer and a second wiring layer; a connector configured at the first wiring layer, the connector includes: a first connector pin; a first connector resistor connected with the first connector pin, a first impedance difference is between a value of the first connector resistor and a preset characteristic impedance; a second connector pin; and a second connector resistor connected with the second connector pin, a second impedance difference between the second connector resistor and the preset characteristic impedance; and a chip configured at the first routing layer, the chip includes: a first chip pin connected with the first connector pin via a first trace of the first wiring layer; a first chip resistor connected with the first chip pin, a third impedance difference between the first chip resistor and the preset characteristic impedance; a second chip pin, a vertical projection of a second trace between the second chip pin and the second connector pin intersects with a vertical projection of the first trace, and part of the second trace is routed at the second wiring layer; and a second chip resistor connected with the second chip pin, a fourth impedance difference is between the second chip resistor and the preset characteristic impedance, a second impedance sum of the fourth impedance difference and the second impedance difference is smaller than a first impedance sum of the first impedance difference and the third impedance difference.

According to another aspect of the disclosure, a method of manufacturing an electronic assembly is provided. The method comprises: configuring a chip at a first wiring layer of a PCB, wherein the chip includes a first chip pin, a first chip resistor, a second chip pin, and a second chip resistor, the first chip resistor is connected with the first chip pin, and the second chip resistor is connected with the second chip pin; configuring a connector at the first wiring layer, wherein the connector includes a first connector pin, a first connector resistor, a second connector pin, and a second connector resistor, the first connector resistor is connected with the first connector pin, and the second connector resistor is connected with the second connector pin; and determining a first trace connected between the first chip pin and the first connector pin and a second trace connected with the second chip pin and the second connector pin according to the first connector resistor, the second connector resistor, the first chip resistor, and the second chip resistor; wherein a vertical projection of the first trace intersects with the vertical projection of the second trace.

In sum, according to the structure of the electronic assembly and the method for manufacturing the electronic assembly in embodiments, when the traces between two chip pins and two connector pins are crossed, the traces are routed according to the internal impedance of the chip pin and the internal impedance of the connector pin. Then, the reflection of the signals due to the change of the wiring layer of the poor impedance matching pins would not be increased, and the reflection loss is thus avoided. As a result, the quality of the signal transmission is improved.

BRIEF DESCRIPTION OF THE DRAWINGS

These and other features, aspects and advantages of the disclosure will become better understood with regard to the following embodiments and accompanying drawings.

DETAILED DESCRIPTION OF THE EMBODIMENTS

Figure 1:
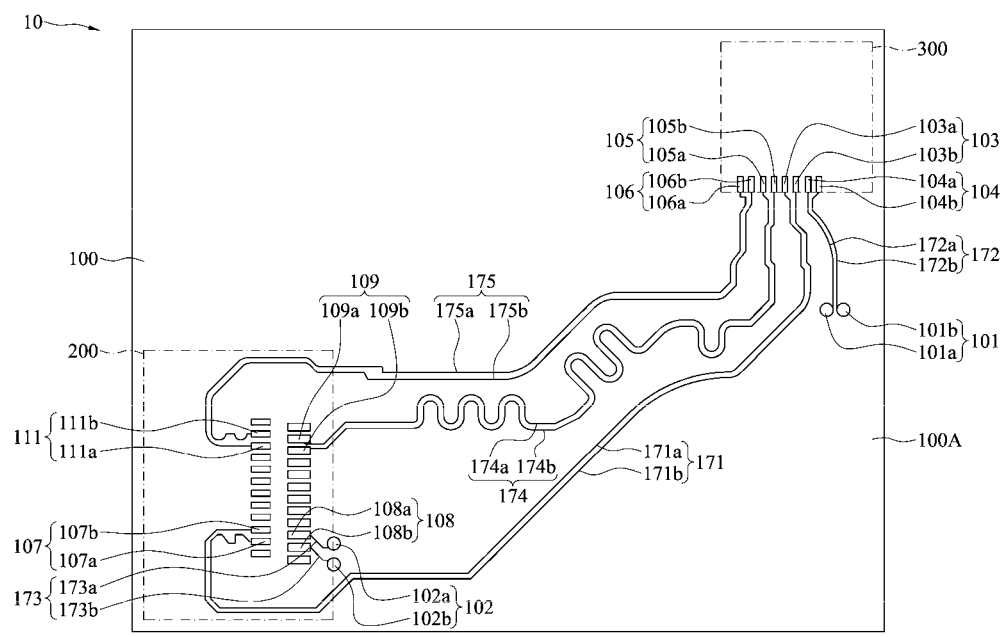
FIG. 1 is a schematic plan showing an electronic assembly in an embodiment.
Figure 1A:
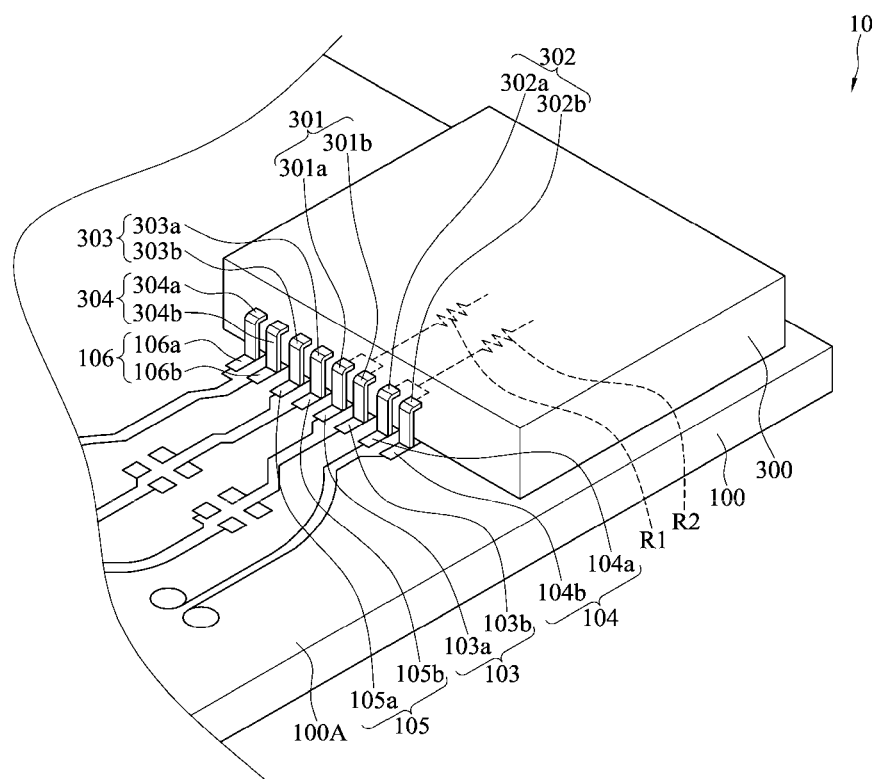
FIG. 1A is an enlarged diagram showing part of the electronic assembly in an embodiment.
Figure 1B:
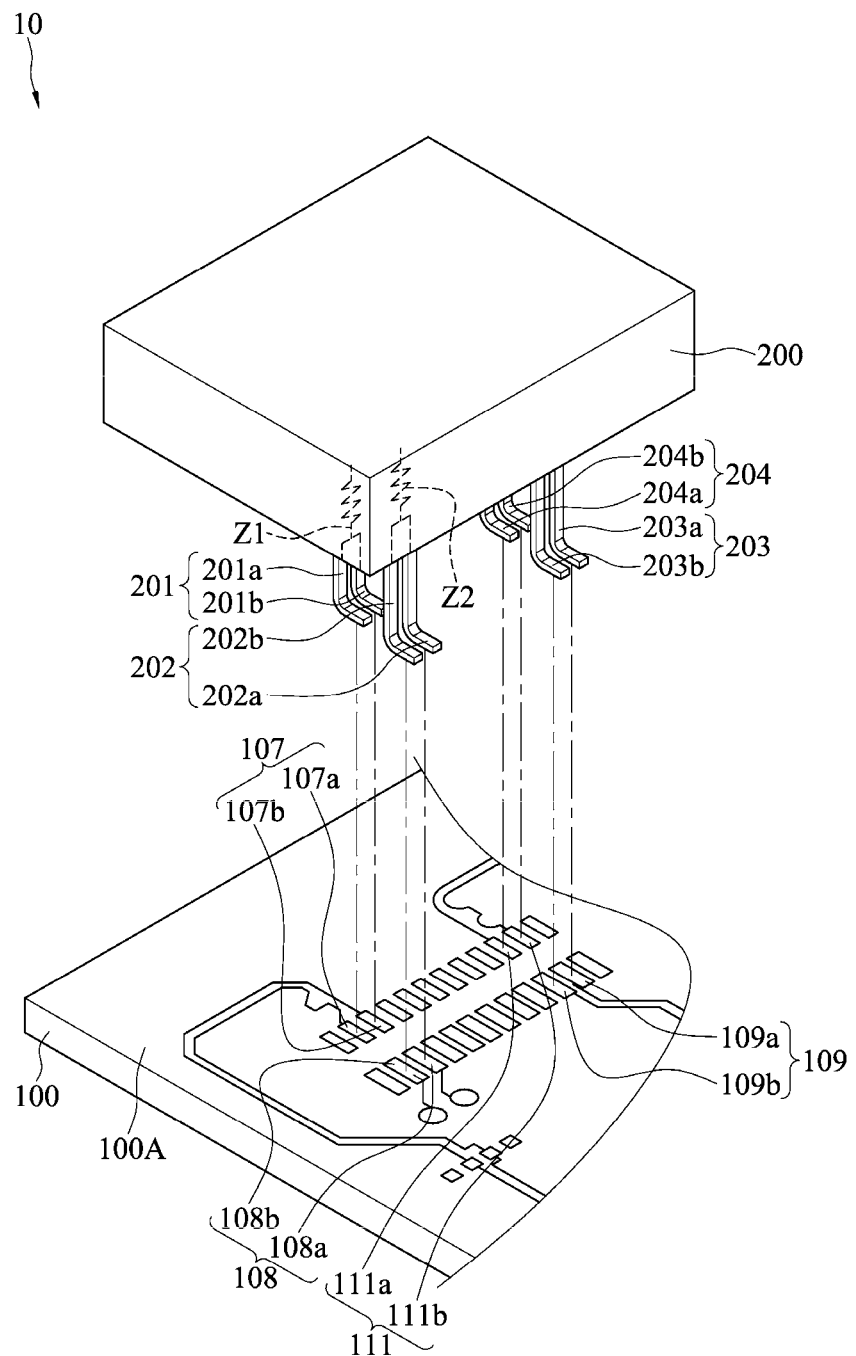
FIG. 1B is an enlarged diagram showing another part of the electronic assembly in FIG. 1 in an embodiment.
Figure 2:
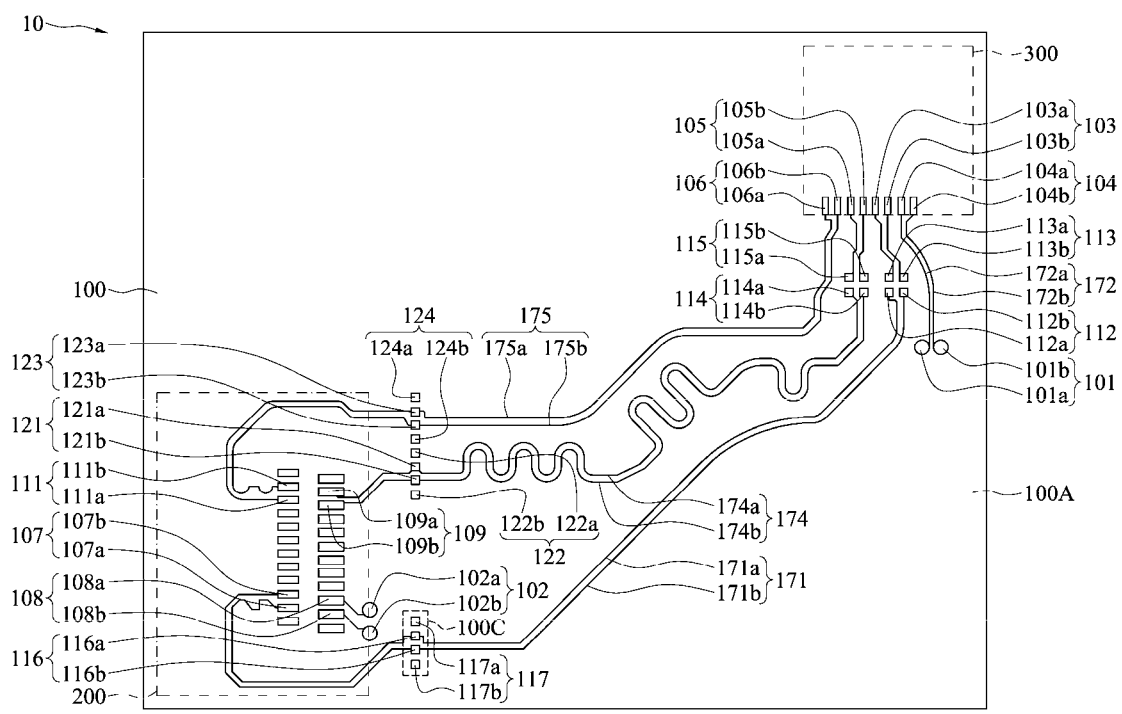
FIG. 2 is a schematic plan showing a first wiring layer in an embodiment.
Figure 3:
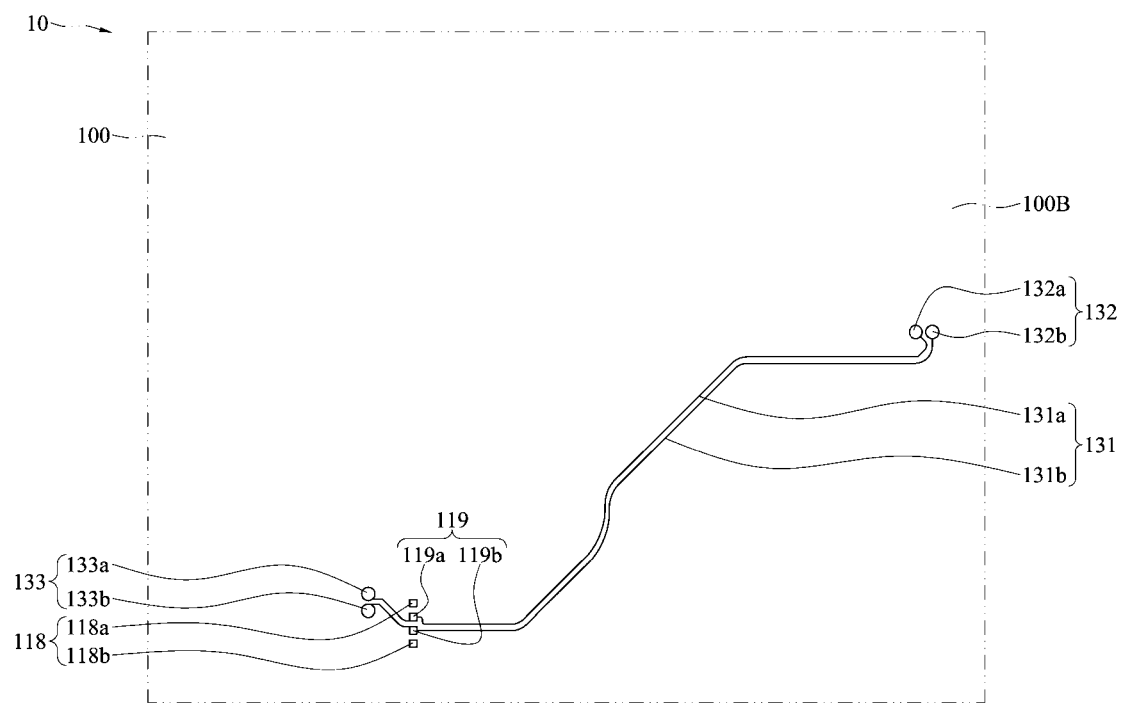
FIG. 3 is a schematic plan showing a second wiring layer in an embodiment.
Figure 4:
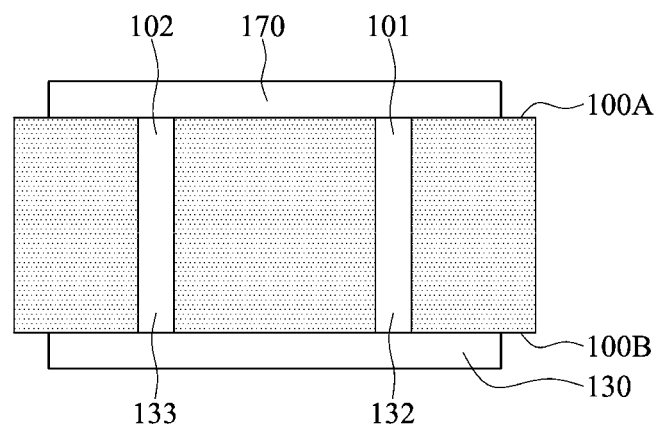
FIG. 4 is an example of the structure of the electronic assembly in FIG. 1 in an embodiment.

FIG. 1 is a schematic plan showing an electronic assembly in an embodiment. FIG. 1A is an enlarged diagram showing part of the electronic assembly in an embodiment. FIG. 1B is an enlarged diagram showing another part of the electronic assembly in FIG. 1 in an embodiment. FIG. 2 is a schematic plan showing a first wiring layer in an embodiment. FIG. 3 is a schematic plan showing a second wiring layer in an embodiment. FIG. 4 is an example of the structure of the electronic assembly in FIG. 1 in an embodiment.

Please refer to FIG. 1 to FIG. 4. The electronic assembly 10 includes a PCB 100, a connector 200, and a chip 300. The PCB 100 includes a first wiring layer 170 and a second wiring layer 130. The first wiring layer 170 includes a plurality of top transmission lines 171 to 175. The top transmission lines 171~175 are shown in FIGS. 1-3 as an example. The top transmission lines 171~175 are configured on the first surface 100A of the PCB 100. The top transmission lines 171~175 are made of metal. The top transmission lines 171~175 (so called a first transmission line 171, a second transmission line 172 and a third transmission line 173 hereinafter) provide signal transmission paths of the first wiring layer 170. The second wiring layer 130 includes an inner layer transmission line 131. As shown in FIG. 3, the inner layer transmission line 131 is configured at the second surface 100B of the PCB 100. In an embodiment, the inner layer transmission line 131 is made of metal. The inner layer transmission line 131 is regarded as a signal transmission path of the second wiring layer 130. In an embodiment, the first wiring layer 170 is a top layer of the PCB. The second wiring layer 130 is a bottom layer of the PCB or a middle layer between the top layer and the bottom layer.

In an embodiment, as shown in FIG. 4, the first wiring layer 170 further includes a first guiding hole 101 and a second guiding hole 102. The second wiring layer 130 further includes a third guiding hole 132 and a fourth guiding hole 133. The first guiding hole 101 is interconnected to the third guiding hole 132. The second guiding hole 102 is interconnected to the fourth guiding hole 133. The guiding holes 101,102, 132, 133 are made of metal. Signals are transmitted between the first wiring layer 170 and the second wiring layer 130 via the interconnection between the first guiding hole 101 and the third guiding hole 132 and the interconnection between the second guiding hole 102 and the fourth guiding hole 133.

The connector 200 and the chip 300 include a plurality of pins, respectively. The pins of the connector 200 are called as connector pins, such as connector pins 201~204 in FIG. 1B. The pins of the chip 300 are called as chip pins, such as chip pins 301~304 in FIG. 1A. The connector pins 201~204 and the chip pins 301~304 are input pins or output pins, respectively. One of the connector pins 201~204 is connected with one of the chip pins 301~304, respectively. In an embodiment, the chip pins 301~304 transmit signals to the connector pins 201~204 to output the signals. The connector pins 201~204 transmit the signals to the chip pins 301~304 to input the signals. In an embodiment, the signals transmitted between the chip pins 301~304 and the connector pins 201~204 are USB signals. That is, the chip 300 is a USB transmission interface chip, and the connector 200 is a USB the connector. USB signals are transmitted between the chip pins 301~304 and the connector pins 201~204. In an embodiment, the chip 300 is a HDMI chip, and the connector 200 is a HDMI connector. In an embodiment, the chip 300 is a thunderbolt chip, and the connector 200 is a thunderbolt connector, which is not limited herein.

When the chip pins 301~304 are connected with the connector pins 201~204, to keep the signal integrity between the chip pins 301~304 and the connector pins 201~204, the connector 200 and the chip 300 are configured at a same wiring layer of the PCB 100, such as the first wiring layer 170. In an embodiment, the traces between the connector pins 201~204 and the chip pins 301~304 are the top transmission line 171~175 of same wiring layer, such as the first wiring layer 170. For example, the chip pin 303 is connected with the connector pin 203 via the top transmission line 174. The chip pin 304 is connected with the connector pin 204 via the top transmission line 175. Consequently, the signal loss caused by the signal transmission in different layers can be avoided.

However, since the trace outlet positions of the connector pins 201~204 and the chip pins 301~304 are constant, if the connector pins 201~204 and the chip pins 301~304 are configured at a same layer, the traces between the connector pins 201~204 and the chip pins 301~304 may be crossed with each other. For example, in FIG. 1, FIG. 1A and FIG. 1B, if the trace between the connector pin 201 and the chip pin 301 is crossed with the trace between the connector pin 202 and the chip pin 302, the traces needs to be configured at different layers. The routing way at different layers is determined according to the internal impedance between the chip pin 301, 302 and the connector pin 201, 202 to form the trace between the chip pin 301 and the connector pin 201, and the trace between the chip pin 302 and the connector pin 202.

As shown in FIG. 1A, the chip 300 includes the chip resistors R1, R2 connected with the chip pins 301 and 302. As shown in FIG. 1B, the connector 200 includes the connector resistors Z1, Z2 connected with the connector pins 201, 202. When the impedance difference between the chip resistors R1, R2 and the preset characteristic impedance of the transmission line is larger, the signal integrity of the chip pins 301, 302 is poorer. When the impedance difference between the connector resistors Z1, Z2 and the preset characteristic impedance is larger, it represents that the signal integrity of the connector pins 201, 202 is poorer. When the signal integrity between the chip pin and the connector pin is poor, the traces between the chip pin and the connector pin needs to be routed at a same layer to avoid the reflection loss due to the increase of the impedance discontinuity when the traces are routed at different layers. In an embodiment, the first impedance difference is between the value of the connector resistors Z1 and the preset characteristic impedance, the second impedance difference is between the value of the connector resistors Z2 and the preset characteristic impedance, the third impedance difference is between the value of the chip resistor R1 and the preset characteristic impedance, and the fourth impedance difference is between the value of the chip resistor R2 and the preset characteristic impedance. When the sum of the first impedance difference and the third impedance difference (called as the first impedance sum) is larger than the sum of the second impedance difference and the fourth impedance difference (called as the second impedance sum), it represented that the signal integrity of the signal transmitted between the chip pin 301 and the connector pin 201 is poor. As shown in FIG. 1, FIG. 1A, and FIG. 1B, the chip pin 301 is connected with the connector pin 201 via the first transmission line 171. Since the first impedance sum is larger than the second impedance sum, it represented that the signal integrity between the chip pin 302 and the connector pin 202 is good. Thus, when the trace between the chip pin 302 and the connector pin 202 are routed at different layers, large reflection loss would not be increased. Furthermore, it avoid that the chip pin 302 and the connector pin 202 is short circuited with the first transmission line 171. As shown in FIG. 1 to FIG. 3, the chip pin 302 is connected with the second transmission line 172, the connector pin 202 is connected with the third transmission line 173, the inner layer transmission line 131 is connected with the third transmission line 173 and the second transmission line 172, and then the chip pin 302 is connected with the connector pin 202 via the second transmission line 172, the inner layer transmission line 131 and the third transmission line 173, but not crossed with the first transmission line 171. In an embodiment, the inner layer transmission line 131 is connected with the third transmission line 173 and the second transmission line 172 via the guiding holes 101, 102, 132, 133. In detail, the second transmission line 172 is connected with the first guiding hole 101. The first guiding hole 101 is interconnected to the third guiding hole 132. The third transmission line 173 is connected with the second guiding hole 102. The second guiding hole 102 is interconnected to the fourth guiding hole 133. Then, the inner layer transmission line 131 is connected with the third guiding hole 132 and the fourth guiding hole 133. As a result, the inner layer transmission line 131 is connected with the third transmission line 173 via the guiding holes 133, 102, and the inner layer transmission line 131 is connected with the second transmission line 172 via the guiding holes 132, 101.

In the above embodiment, in the traces between the chip 300 and the connector 200, only the traces between the chip pin 302 and the connector pin 202 are disposed at different layers, and therefore the signal integrity of most pins of the chip pins 301~304 and the connector pins 201~204 is kept.

Figure 8:
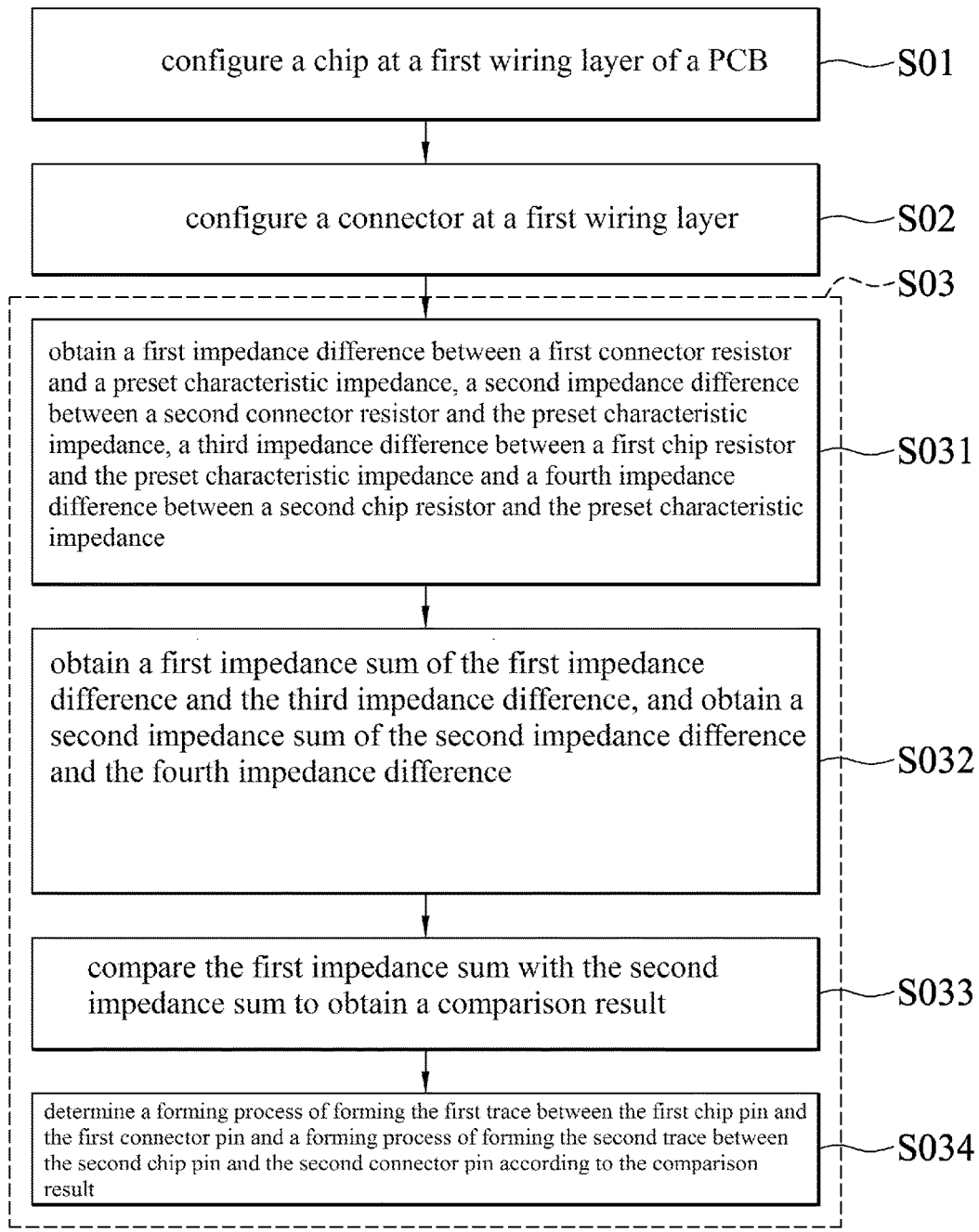
FIG. 8 is a flow chart showing a method of manufacturing the electronic assembly in an embodiment.

FIG. 8 is a flow chart showing a method of manufacturing the electronic assembly in an embodiment. Please refer to FIG. 1 to FIG. 4 and FIG. 8, in the manufacture of the electronic assembly 10, the chip 300 is configured at the first wiring layer 170 of the PCB 100 (step S01), and the connector 200 is configured at the first wiring layer 170 (step S02). Then, if the trace between the chip pin 301 and the connector pin 201 (that is the connection line between the first guiding hole 101 and the second guiding hole 102) and the trace between the chip pin 302 and the connector pin 202 are routed at a same wiring layer, the traces are crossed, and the short circuit is easily generated. When it is determined that the traces configured at a same wiring layer would be crossed, the first trace between the chip pin 301 (the first chip pin) and the connector pin 201 (the first connector pin) and the second trace between the chip pin 302 (the second chip pin) and the connector pin 202 (the second connector pin) are determined according to the connector resistor Z1 (the first connector resistor), the connector resistor Z2 (the second connector resistor), the chip resistor R1 (the first chip resistor) and the chip resistor R2 (the second chip resistor) (step S03). In the embodiment, the vertical projection of the first trace intersects with the vertical projection of the second trace.

In an embodiment, in step S03, the impedance differences between the chip resistors R1, R2 and the preset characteristic impedance and the impedance difference between the connector resistors Z1, Z2 and the preset characteristic impedance are obtained. The step S03 includes sub steps S031, S032, S033, and S034. In step S031, the first impedance difference between the first connector resistors and the preset characteristic impedance, the second impedance difference between the second connector resistors and the preset characteristic impedance, the third impedance difference between the first chip resistor and the preset characteristic impedance, and the fourth impedance difference between the second chip resistor and the preset characteristic impedance are obtained. In step S032, the first impedance sum of the first impedance difference and the third impedance difference is obtained, and the second impedance sum of the second impedance difference and the fourth impedance difference is obtained. In step S033, a comparison result is obtained by comparing the first impedance sum with the second impedance sum. In step S034, a forming process of forming the first trace between the first chip pin and the first connector pin and a forming process of forming the second trace between the second chip pin and the second connector pin are determined according to the comparison result.

In step S034, when the comparison result is that the first impedance sum is larger than the second impedance sum, the traces between the chip pin 301 and the connector pin 201 are disposed at a same layer, and the traces between the chip pin 302 and the connector pin 202 are disposed at different layers. That is, the way of forming the first trace is that the first transmission line 171 is formed at the first wiring layer 170 to be connected with the chip pin 301 and the connector pin 201. The way of forming the second trace is that the second transmission line 172 is formed at the first wiring layer 170 to be connected with the first guiding hole 101 and the chip pin 302, the inner layer transmission line 131 is formed at the second wiring layer 130 to be connected with the third guiding hole 132 and the fourth guiding hole 133, and the third transmission line 173 is formed at the first wiring layer 170 to be connected with the second guiding hole 102 and the connector pin 202.

In an embodiment, the preset characteristic impedance relates to the application of the connector 200 and the chip 300. For example, in the USB transmission application, the value of the preset characteristic impedance is 85 ohm. That is, the characteristic impedance of each transmission line conforms to the preset characteristic impedance 85 ohm. In the HDMI transmission application, the value of the preset characteristic impedance is 100 ohm. That is, the characteristic impedance of each transmission line conforms to the preset characteristic impedance 100 ohm.

In embodiments, the chip resistors R1, R2 and the connector resistors Z1, Z2 match or does not match the preset characteristic impedance. In an embodiment, in USB transmission application, the impedance value of the chip resistor R2 and the connector resistor Z2 are both 85 ohm, which match the preset characteristic impedance to make the second impedance sum is zero. In an embodiment, one of the chip resistor R1 and the connector resistor Z1 matches the preset characteristic impedance. For example, the value of the chip resistor R1 and the connector resistor Z1 are 85 ohm and 75 ohm, respectively. In an embodiment, both the chip resistor R1 and the connector resistor Z1 do not match the preset characteristic impedance. For example, the value of the chip resistor R1 and the connector resistor Z1 is 60 ohm and 45 ohm, respectively. Then, the first impedance sum is not zero while the second impedance sum is zero. The first impedance sum is larger than the second impedance sum.

In an embodiment, one of the chip resistor R2 and the connector resistors Z2 matches the preset characteristic impedance, and one of the chip resistor R1 and the connector resistor Z1 matches the preset characteristic impedance. For example, the value of the chip resistor R2 is 85 ohm, the value of the connector resistors Z2 is 60 ohm, the value of the connector resistors Z1 is 40 ohm, and the value of the chip resistor R1 is 85 ohm. The first impedance sum is 45 ohm, which is larger than the second impedance sum of 25 ohm.

In an embodiment, all of the chip resistors R1, R2 and the connector resistors Z1, Z2 do not match the preset characteristic impedance. For example, the values of the chip resistors R1, R2 are 75 ohm and 70 ohm, respectively. The values of the connector resistors Z1, Z2 are 45 ohm and 60 ohm. The first impedance sum is 50 ohm, which is larger than the second impedance sum of 40 ohm. Others can be deduced by analogy, which is not repeated again.

In an embodiment, please refer to FIG. 2 and FIG. 3. The electronic assembly 10 includes a plurality of metal pads 103~109, 111~119, and 121~124. The metal pads 103~109, 111~118, and 121~124 are configured at the first wiring layer 170. The chip pins 301~304 and the connector pins 201~204 are welded to the first surface 100A via the metal pads 103~109, 111. In an embodiment, the electronic assembly 10 further includes a plurality of capacitors and a plurality of electrostatic protection components. A plurality of capacitors are welded to the first wiring layer 170 via the metal pads 112~115. Taking the metal pads 112, 113 as an example, two pins of a capacitor are welded to the metal pads 112, 113, respectively. Then, the capacitor is adjacent to the chip pins 301~304 to block DC signals. The metal pad 119 locates at the second wiring layer 130. A plurality of electrostatic protection components are welded to the first wiring layer 170 and the second wiring layer 130 via the metal pads 116~119, 121~124. Taking the metal pads 123, 124 as an example, two pins of the electrostatic protection component are welded to the metal pads 123, 124. The metal pad 124 is connected with ground via the transmission line of the first wiring layer 170. Then, the electrostatic protection component is adjacent to the connector pins 201~204. As a result, the surge noise due to the electrostatic effect is avoided.

In the above embodiments, the impedance value of each metal pad relates the signal integrity. In an embodiment, since the impedance value of the metal pads 103~109, 111~119, 121~124 does not match the preset characteristic impedance, the impedance discontinuity is generated when the signal passes the metal pads 103~109, 111~119, 121~124. Therefore, the signal integrity is affected due to the signal reflection generated by the impedance discontinuity. In an embodiment, when the welding width between the connection of the metal pad 115 and the top transmission line 174 is larger than the line width of the top transmission line 174, the impedance value of the metal pad 115 is smaller than the characteristic impedance of the top transmission line 174. The impedance value of the metal pad 115 relates to the metal material below the metal pad 115. The metal pad 115 includes a corresponding impedance value due to the capacitance effect generated between the metal pad 115 and the metal material therebelow. Therefore, the impedance of the metal pad 115 is compared the preset characteristic impedance first. When the metal pad 115 does not match the preset characteristic impedance, the distance between the metal pad 115 and the metal material below the metal pad 115 is adjusted to change the impedance of the metal pad 115.

Figure 5:
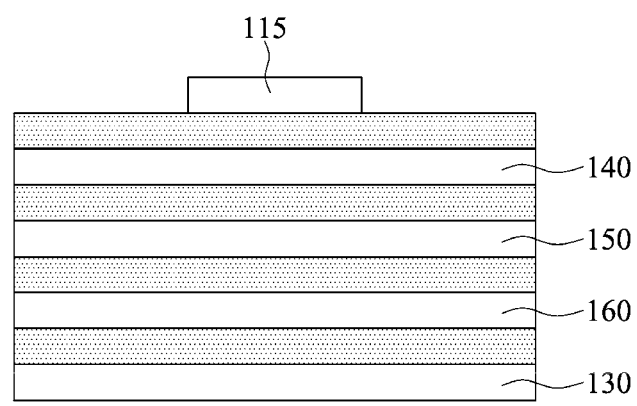
FIG. 5 is an example of the structure of the electronic assembly in FIG. 1 in an embodiment.
Figure 6:
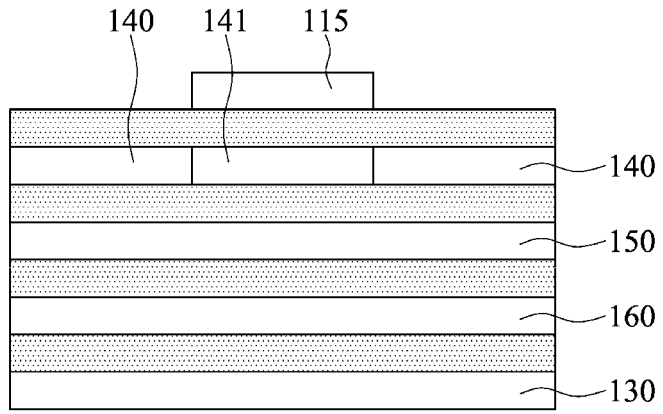
FIG. 6 is a schematic diagram showing the electronic assembly in FIG. 5 with a hollowed-out region in an embodiment.
Figure 7:
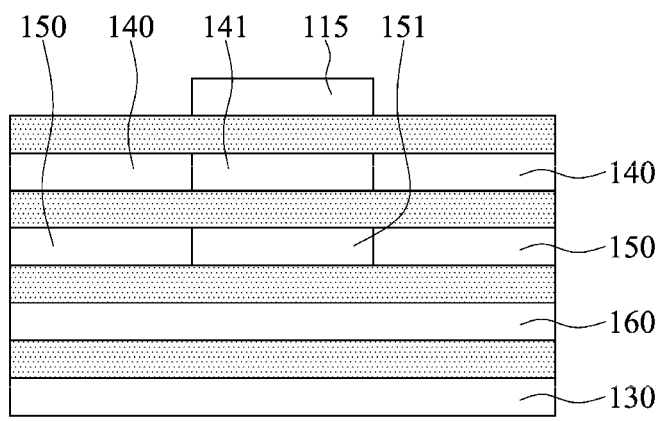
FIG. 7 is a schematic diagram showing the electronic assembly in FIG. 6 with a hollowed-out region in an embodiment.

FIG. 5 is an example of the structure of the electronic assembly in FIG. 1 in an embodiment. FIG. 6 is a schematic diagram showing the electronic assembly in FIG. 5 with a hollowed-out region in an embodiment. In FIG. 5 and FIG. 6, the PCB 100 has five layers. The metal pad 115 is used to represent the first wiring layer 170. Please refer to FIG. 5 and FIG. 6, the PCB 100 further includes three metal layers 140, 150, 160. The metal layers 140, 150, 160 are between the metal pad 115 and the second wiring layer 130. The metal layer 140 is between the metal pad 115 and the metal layer 150. The metal layer 150 is between the metal layer 140 and the metal layer 160. The metal layer 160 is between the metal layer 150 and the second wiring layer 130. A dielectric layer is formed between the metal layer 140 and the metal pad 115, between the metal layer 140 and the metal layer 150, between the metal layer 150 and the metal layer 160, and between the metal layer 160 and the second wiring layer 130, respectively, to isolate corresponding layers. In FIG. 5 and FIG. 7, the dielectric layer is shown as the dotted area. In an embodiment, the metal layers 140, 150, 160 are a ground layer, a power source layer, and a signal layer, respectively, which is not limited herein.

After the comparison of the impedance of the metal pad 115 and the preset characteristic impedance, when the impedance of the metal pad 115 is smaller than the preset characteristic impedance, the metal layer 140 right below part of the metal pad 115 is hollowed to form the hollowed-out region 141 at the metal layer 140. As shown in FIG. 6, the metal layer 140 includes the hollowed-out region 141. The hollowed-out region 141 at the projection region of the first wiring layer 170 is overlapped with the metal pad 115. Thus, no metal material is right below the metal pad 115. In comparison with the metal pad 115 in FIG. 5 of which the metal material of the metal layer 140 is right below the metal layer 140, the reference plane of the impedance of the metal pad 115 is changed from the metal layer 140 to the metal layer 150. That is, the distance between the metal pad 115 and the metal material therebelow is increased. Consequently, the impedance value of the metal pad 115 is increased to match the preset characteristic impedance. Then, the signal integrity and the impedance continuity are kept. As a result, when the impedance value of one of the metal pads 103~109, 111~119, 121~124 is smaller than the preset characteristic impedance, a hollowed-out region is formed right below the metal layer 140 of the metal pad which does not match the preset characteristic impedance to adjust the impedance value of the metal pads 103~109, 111~119, and 121~124.

In an embodiment, the impedance value of a plurality of metal pads in an adjacent region does not match the preset characteristic impedance. As shown in FIG. 2, taking the metal pads 116, 117 as an example, the projection region 100C of the hollowed-out region 141 at the first wiring layer 170 is overlapped with the metal pads 116, 117. That is, one hollowed-out region 141 formed between the metal pads 116, 117 whose impedances do not match the preset characteristic impedance is enough to cover the metal pad 116, 117. Thus, the manufacture is easy.

After the hollowed-out region 141 is formed, the impedance of the metal pad 115 is compared with the preset characteristic impedance again. When the impedance value of the metal pad 115 is smaller than the preset characteristic impedance (that is, the metal pad 115 still does not match the preset characteristic impedance), in an embodiment, a hollowed-out region 151 is formed at the metal layer 150. FIG. 7 is a schematic diagram showing the electronic assembly in FIG. 6 with another hollowed-out region in an embodiment. As shown in FIG. 7, the metal layer 150 includes a hollowed-out region 151. The projection region of the hollowed-out region 151 at the first wiring layer 170 is overlapped with the metal pad 115. Then, the reference plane of the impedance value of the metal pad 115 is changed from the metal layer 150 to the metal layer 160. Consequently, the impedance value of the metal pad 115 is increased to match the preset characteristic impedance for keeping the signal integrity and the impedance continuity.

In an embodiment, signals transmitted from the connector pins 201~204 and the chip pins 301~304 are differential signals. That is, as shown in FIG. 1 to FIG. 3, each of the connector pins 201~204 includes two differential pins (201a~204a and 201b~204b). Each of the chip pins 301~304 includes two differential pins (301a-304a, 301b-b).

Each of the transmission lines 171~175 includes two differential transmission lines (171a~175a, 171b~175b). The inner layer transmission line 131 includes two differential transmission lines (131a, 131b). Each of the guiding holes 101, 102, 132, 133 includes two guiding holes (101a, 102a, 132a, 133a, 101b, 102b, 132b, 133b), respectively. The metal pads 103~109, 111~119, 121~124 includes two metal pads (103a-109a, 111a-119a, 121a-124a, 103b-109b, 111b-119b, 121b-124b) corresponding to differential signals, respectively.

In sum, according to the structure of the electronic assembly and the method for manufacturing the electronic assembly in embodiments, when the traces between two chip pins and two connector pins are crossed, the traces can be routed according to the internal impedance of the chip pin and the internal impedance of the connector pin. Then, the reflection loss of the pins whose impedance matching is poor would not be increased due to the reflection of the signals. As a result, the quality of the signal transmission is improved.

Although the disclosure has been disclosed with reference to certain embodiments thereof, the disclosure is not for limiting the scope. Persons having ordinary skill in the art may make various modifications and changes without departing from the scope of the disclosure. Therefore, the scope of the appended claims should not be limited to the description of the embodiments described above.

What is claimed is:

1. An electronic assembly, comprising:
a Printed circuit board (PCB) including a first wiring layer and a second wiring layer;
a connector configured at the first wiring layer, the connector includes:
a first connector pin;
a first connector resistor connected with the first connector pin, there is a first impedance difference between the first connector resistor and a preset characteristic impedance;
a second connector pin; and
a second connector resistor connected with the second connector pin, there is a second impedance difference between the second connector resistor and the preset characteristic impedance; and
a chip configured at the first wiring layer, the chip includes:
a first chip pin connected with the first connector pin via a first trace of the first wiring layer;
a first chip resistor connected with the first chip pin, there is a third impedance difference between the first chip resistor and the preset characteristic impedance;
a second chip pin, a vertical projection of a second trace between the second chip pin and the second connector pin intersects with a vertical projection of the first trace, and part of the second trace is configured at the second wiring layer; and
a second chip resistor connected with the second chip pin, there is a fourth impedance difference between the second chip resistor and the preset characteristic impedance, a second impedance sum of the fourth impedance difference and the second impedance difference is smaller than a first impedance sum of the first impedance difference and the third impedance difference.

2. The electronic assembly according to claim 1, wherein the second trace includes:
a first guiding hole configured at the first wiring layer;
a second guiding hole configured at the first wiring layer;
a second transmission line configured at the first wiring layer and connected with the second chip pin and the first guiding hole;
a third transmission line configured at the first wiring layer and connected with the second connector pin and the second guiding hole;
a third guiding hole configured at the second wiring layer and interconnected to the first guiding hole;
a fourth guiding hole configured at the second wiring layer and interconnected to the second guiding hole; and
an inner layer transmission line configured at the second wiring layer and connected with the third guiding hole and the fourth guiding hole.

3. The electronic assembly according to claim 1, wherein the second chip resistor and the second connector resistor match the preset characteristic impedance.

4. The electronic assembly according to claim 3, wherein one of the first chip resistor and the first connector resistor does not match the preset characteristic impedance.

5. The electronic assembly according to claim 1, wherein one of the second chip resistor and the second connector resistor matches the preset characteristic impedance, and one of the first chip resistor and the first connector resistor matches the preset characteristic impedance.

6. The electronic assembly according to claim 1, wherein the first chip resistor, the second chip resistor, the first connector resistor, and the second connector resistor do not match the preset characteristic impedance.

7. A method of manufacturing an electronic assembly, comprising:
configuring a chip at a first wiring layer of a PCB, wherein the chip includes a first chip pin, a first chip resistor, a second chip pin, and a second chip resistor, the first chip resistor is connected with the first chip pin, and the second chip resistor is connected with the second chip pin;
configuring a connector at the first wiring layer, wherein the connector includes a first connector pin, a first connector resistor, a second connector pin, and a second connector resistor, the first connector resistor is connected with the first connector pin, and the second connector resistor is connected with the second connector pin; and
determining a first trace connected between the first chip pin and the first connector pin and a second trace connected with the second chip pin and the second connector pin according to the first connector resistor, the second connector resistor, the first chip resistor, and the second chip resistor;
wherein a vertical projection of the first trace intersects with the vertical projection of the second trace.

8. The method according to claim 7, wherein in the step of determining the first trace and the second trace second chip resistor according to the first connector resistor, the second connector resistor, the first chip resistor, and the second chip resistor, further comprising:
obtaining a first impedance difference between the first connector resistor and a preset characteristic impedance, a second impedance difference between the second connector resistor and the preset characteristic impedance, a third impedance difference between the first chip resistor and the preset characteristic impedance and a fourth impedance difference between the second chip resistor and the preset characteristic impedance;

obtaining a first impedance sum of the first impedance difference and the third impedance difference and a second impedance sum of the second impedance difference and the fourth impedance difference;

comparing the first impedance sum with the second impedance sum to obtain a comparison result; and determining a forming process of forming the first trace and a forming process of forming the second trace according to the comparison result.

9. The method according to claim 8, wherein when the comparison result is that the first impedance sum is larger than the second impedance sum, the forming process of forming the first trace is that forming a first transmission line at the first wiring layer, and the first transmission line is connected with the first chip pin and the first connector pin.

10. The method according to claim 8, wherein when the comparison result is that the first impedance sum is larger than the second impedance sum, the forming process of forming the second trace includes:

forming a second transmission line at the first wiring layer, the second transmission line is connected with the second chip pin and a first guiding hole which is configured at the first wiring layer; and forming an inner layer transmission line at a second wiring layer of the PCB, wherein the inner layer transmission line is connected with a third guiding hole of the second wiring layer and a fourth guiding hole of the second wiring layer; and forming a third transmission line at the first wiring layer, wherein the third transmission line is connected with a second guiding hole at the first wiring layer and the second connector pin;

wherein the third guiding hole is interconnected to the first guiding hole, and the fourth guiding hole is interconnected to the second guiding hole.

* * * * *